United States Patent
Rabinovici et al.

(10) Patent No.: US 9,293,609 B2
(45) Date of Patent: Mar. 22, 2016

(54) CAMERA CONTROLLED SOLAR CELLS ARRAY

(76) Inventors: Raul Rabinovici, BeerSheba (IL); Yotam Frechter, Rehovot (IL)

(*) Notice: Subject to any disclaimer, the term of this patent is extended or adjusted under 35 U.S.C. 154(b) by 643 days.

(21) Appl. No.: 13/229,942

(22) Filed: Sep. 12, 2011

(65) Prior Publication Data
US 2012/0062036 A1    Mar. 15, 2012

Related U.S. Application Data

(60) Provisional application No. 61/381,991, filed on Sep. 12, 2010.

(51) Int. Cl.
*H02J 1/10* (2006.01)
*H01L 31/02* (2006.01)

(52) U.S. Cl.
CPC ........... *H01L 31/02021* (2013.01); *Y02E 10/50* (2013.01); *Y10T 307/685* (2015.04)

(58) Field of Classification Search
CPC ................................................. H01L 31/02021
USPC ........................................................... 307/43
See application file for complete search history.

(56) References Cited

U.S. PATENT DOCUMENTS

| | | | | |
|---|---|---|---|---|
| 8,872,083 B2* | 10/2014 | Cherukupalli | ............. | 250/203.4 |
| 2005/0002214 A1* | 1/2005 | Deng et al. | ..................... | 363/131 |
| 2010/0147354 A1* | 6/2010 | Takehara et al. | ............... | 136/244 |
| 2010/0186795 A1* | 7/2010 | Gaul | ............................. | 136/244 |
| 2013/0054037 A1* | 2/2013 | Ikawa et al. | ................... | 700/286 |
| 2013/0068284 A1* | 3/2013 | Beardsworth et al. | ........ | 136/246 |

\* cited by examiner

*Primary Examiner* — Daniel Cavallari

(57) ABSTRACT

A system and a method for improving the operation, utility, and exploitation of solar cell fields are introduced. The system includes all or parts of the following: a solar cells array, an interconnect matrix, a measuring sub-system for measuring environmental conditions as ambient temperature and/or ambient wind speed, and/or ambient wind direction, a direct current to alternating current inverter, a measuring sub-system for measuring on-line (instantaneous) values of working points of solar cells, and/or solar panels, and/or a group of solar panels, a camera pointed at the all of solar panels or groups of solar panels, and a digital processor that using the measured environmental conditions and the measured on-line working points data evaluates the solar cells array's maximum power point; and using partial or full meandering of the solar cells in the solar cells array, achieves near-optimal performance of the solar cells array.

1 Claim, 15 Drawing Sheets

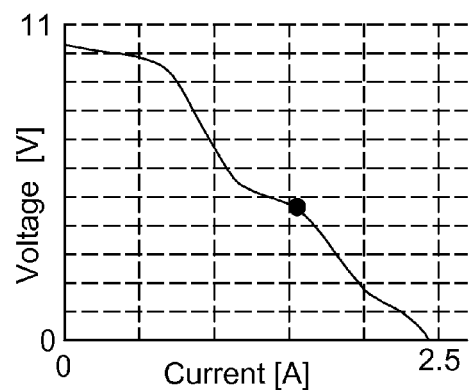
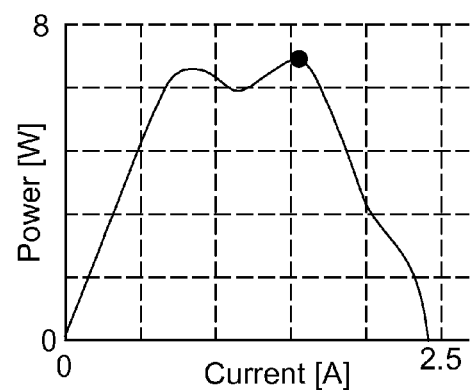
Fig. 13a  Fig. 13b
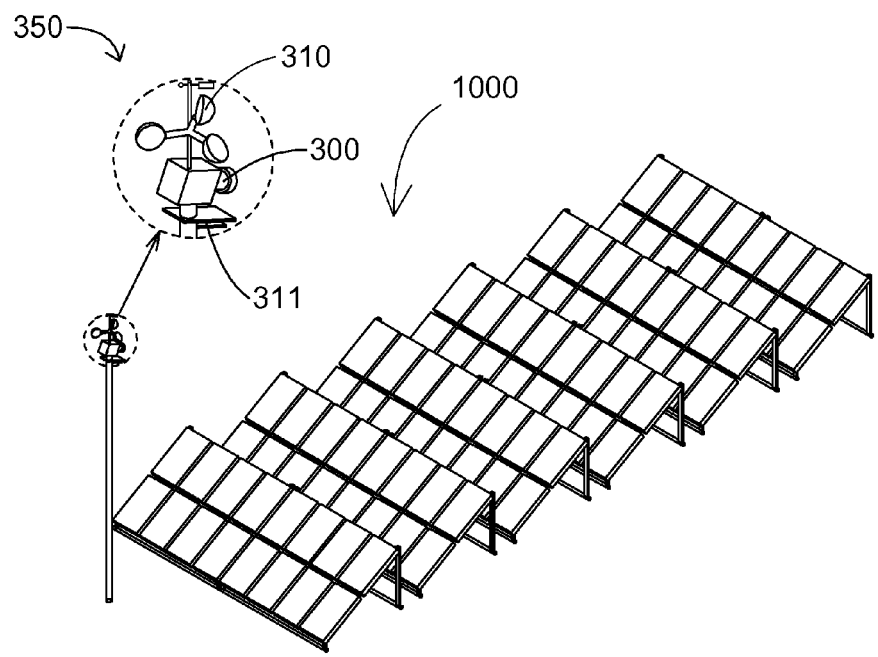
Fig. 14

CAMERA CONTROLLED SOLAR CELLS ARRAY

REFERENCE TO CROSS-RELATED APPLICATION

This application claims priority benefits from U.S. Patent Application No. 61/381,991 filed Sep. 12, 2010.

FIELD OF THE INVENTION

The present invention relates to solar cells, more particularly, to systems for improving the operation, utility, and exploitation conditions of solar cell fields.

BACKGROUND OF THE INVENTION

Solar Photo-Voltaic (PV) cells have been used to convert solar light energy into electrical energy for many years. Such cells are used to power many kinds of appliances from small calculators, through solar powered vehicles, and up to large solar cells arrays capable of producing large amounts of power for the purpose of supplying regional power grids.

FIG. 1 of the prior art is an exemplary arrangement of a solar cell array 1000, which is comprised of a multitude of solar cell panels 100 arranged in a grid formation. Each solar cells panel 100 is comprised of a grid of individual solar cells 10 (as seen in FIG. 2a), which are normally connected in series and/or in parallel.

As shown in the present illustration, certain areas of the solar cell array 1000 are shaded, for example shading from solar cells panel 100s and shading from building 200s. Just as a nearby building 200 can cast shade, other objects such as nearby trees or clouds passing in the sky can cast shade. The state of the shade, its extent, its location upon the solar cell array 1000 changes with time, and with environmental conditions. Clearly, any reduction in the light radiation upon the solar cell array 1000 diminishes its capacity for production of electrical output.

FIG. 2a of the prior art is an isometric schematic illustration of an illustrative, only as a possible example exemplary embodiment of a solar cell 10. There are also other types of PV solar cells than the type depicted here, e.g., organic cells. The solar cell 10, of Mono Crystalline Silicon type, is made from two types of semiconductors: an N-type semiconductor 11 and a P-type semiconductor 12. Since the N-type semiconductor 11 has an excess amount of free electrons 13 and the P-type semiconductor 12 has an excess of free holes 14, a depletion region is created when the two semiconductor materials are connected and that forms a diode. When a semiconductor is exposed to light, the semiconductor releases electrons to move freely within the semiconductor. When a diode is exposed to light, the release of electrons causes the electrical field within the solar cell to increase due to the formation of electron-hole pairs within the solar cells, causing a potential difference (i.e., voltage) to appear between the front contact 16 and the back contact 15. Adding a load between the front contacts 16 to the back contact 15 would cause a current to flow between the contacts. The anti-reflective coating 17 is used to reduce the loss of photons that may be reflected off of the semiconductor material thereby reducing its efficiency. A glass cover 18 is used to protect the solar cell from outside elements and contaminates.

FIG. 2b of the prior art describes a well-known electrical model for a photo-voltaic solar cell known as the "ten-parameter" model.

One of the major problems occurring within large solar cell arrays is the presence of weak cells. Weak cells supply less power than other cells in the array and change from supplying power to the external load to becoming a load themselves that will suck up electrical power from the other solar cells. The weak solar cells could appear due to degradation in the performance of the cells due to aging as well as shade falling on the cells. Such shade may be cast by nearby objects such as buildings and trees located near the array or other solar cells panels within the array, by clouds, or by dust present on the solar cell surface.

FIG. 3a of the prior art is a schematic electrical representation of a solar cell equipped with a bypass diode.

The present figure depicts an exemplary solution, used to address the issue (as described with regard to the previous illustration), by adding a bypass diode D in parallel to a solar cell 10. When such a cells' performance degrades due to aging or shading, the internal current it produces would be lower than the internal currents produced by the other cells in the array. The bypass diode would permit the pass of the whole current not only through the bypassed weak solar cell but also through the bypassing diode itself.

FIG. 3b of the prior art is a schematic electrical representation of a solar cells chains block 60 including a set of solar cells chains 50, each equipped with a blocking diode D.

An option for avoiding the use of weak cells is by using blocking diodes. Some solar cells chains blocks 60 are comprised of several solar cells chains 50 of series of solar cells connected in parallel. For each solar cells chain 50, there is one blocking diode. When the performance of one or more of the solar cells 10 in a specific solar cells chain 50 performance weakens, e.g., due to temperature differences, the voltage produced by the solar cells chain 50 drops. If there is no blocking diode, current flows from other solar cells chains 50 into the weak solar cells chain 50, thereby reducing the total current flowing out of the solar cells chains block 60. With the blocking diode, no current would flow back into the weak solar cells chain 50.

However, using blocking diodes disables a whole solar cell chain 50, which may include fully functional solar cells 10. This reduces the output power of the solar cells chains block 60 by the number of cells in the blocked chain.

Blocking diodes 30 are mandatory whenever the solar cells chains block 60 needs to be protected from backward current from the grid (e.g. during night where no safety switches installed). If it is an independent system with a charge controller, blocking diodes 30 are redundant. In such a case, only bypass diodes are used.

FIG. 3c of the prior art is a schematic electrical representation of a solar cells chain 50 of four solar cells 10, each equipped with a bypass diode D.

The present figure illustrates an exemplary arrangement of four solar cells 10 serially connected into a solar cells chain 50 with a bypass diode D connected in parallel to each of the solar cells. In this figure, one of the cells ($10_4$) is shaded and receives only two thirds of the illumination received by the other cells.

FIG. 3d is a graph of simulation results of the effect of different bypass diodes on the performance of a solar cells chain 50, according to the present invention.

The present figure shows the simulations result graphs of the solar cells chains' 50 performance using different types of bypass diodes with ranging forward voltage (Vf). The continuous line depicts the case where no bypass diode is used. The dashed lines depict the effect that the different bypass diodes have. From the graph, it is easy to see that as the diodes' Vf increases, the efficiency of the chain decreases.

However, the maximum power point (MPP) does not change in this specific case. Since the bypass diode eliminates a cell, it is not possible to associate the weak cell to the power supplied by the solar array to the load. Using bypass diodes reduces the output power of the solar cells panel 100 as the number of solar cells 10 being used decreased causing the solar cells panel 100 to operate with less than the maximum number of solar cells 10.

FIG. 4a of the prior art is a schematic block diagram of a system for harvesting solar energy.

In order to achieve the optimum performance of a solar cell structure (a chain, a panel, an array etc.), a Maximum Power Point Tracker (MPPT) 102 may be used.

The MPPT 102 searches the IN curve of the solar cell structure for the Maximum Power Point (MPP) and presents an optimal electrical load to a solar cell structure and produces a voltage suitable for the load. The MPPT 102 is sometimes referred to as a "DC/DC converter".

The solar cells 10 provide a voltage V1. The MPPT 102 sets its load for the solar cells 10 in order to enable the solar cell 10 to operate at its MPP and converts the solar cell's 10 output voltage V1 to a voltage V2 suitable for the DC/AC inverter 104. The DC/AC inverter 104 inverts the DC voltage V2 into AC voltage, which can be supplied to the power grid 106.

The main disadvantages of the MPPT 102 are its cost and it efficiency. The MPPT 102 is too expensive to be used by every solar cell 10 or every solar cells panel 100 and is usually used only at the whole solar cells array 1000 level. But, since different solar cells panels 100 may have different IN curves, i.e. different MPPs (due to manufacturing tolerance, partial shading, etc.). This architecture may cause some solar cells panel 100 to perform below their MPP, resulting in the loss of energy. The other main disadvantage of the MPPT 102 is its own efficiency. The best MPPTs 102 currently available have 97% efficiency. This means that at least 3% of the harvested power is wasted just by using an MPPT 102.

If the cells can be reconnected by a meandering scheme, the entire problem can be averted. The only caveat is that in order to perform meandering, the cells/panels have to be sorted by the maximal power that each can supply. Apparently the only way to discover this power is to use a sniffing algorithm which either uses a variable load by use of a DC-DC converter 102 or physically connects loads to test which perform better, but due to the possibility of the presence of local maxima on the PP curve, there is absolutely no assurance this would find the absolute maximum.

Another way to find the power of the cells/panels is by using the well-known "ten-parameters model" which is described in FIG. 2b and complies with the following formula:

$$I = I_{ph} - I_{0_1}(e^{(V+I \cdot R_s)/V_T n_1} - 1) - I_{0_2}(e^{(V+I \cdot R_s)/V_T n_2} - 1) - \frac{V+I \cdot R_s}{R_{sh}} - \alpha \frac{V+I \cdot R_s}{R_{sh}} \left(1 - \frac{V+I \cdot R_s}{V_{br}}\right)^{-m}$$

However, $I_{ph}$, $I_{01}$ and $I_{02}$ depend on the temperature and $I_{ph}$ also depend on the illumination. But, this dependence can be used to acquire an estimation of the temperature and the illumination given a single current and voltage measurement when having the ten-parameters known in advance; however an initial temperature and wind speed measurement by a single thermometer and a single anemometer for the whole solar field is necessary to start the iterations: Once an initial cell temperature is known, new values for $I_{01}$ and $I_{02}$ can be substituted by the temperature dependency: Assume the parameters tested on cell temperature $T_0$. Then, the parameters at another temperature $T_1$ relate to the parameters at $T_0$ by the following equations $$I_{0_1}(T_1) = I_{0_1}(T_0) \cdot \left(\frac{T_1}{T_0}\right)^3 e^{1.3 \cdot 10^4 \left(\frac{1}{T_0} - \frac{1}{T_1}\right)}$$

$$I_{0_2}(T_1) = I_{0_2}(T_0) \cdot \left(\frac{T_1}{T_0}\right)^{3/2} e^{0.65 \cdot 10^4 \left(\frac{1}{T_0} - \frac{1}{T_1}\right)}$$

and $$I_{PH} \approx I_{sc}(T_1) = I_{sc}(T_0) + \alpha_1(T_1 - T_0)$$

where $\alpha_1$ is a constant that the cell manufacturer supplies, and is dependent on the cell geometry. If it is not known, it is possible to measure it easily in a short circuit experiment in different temperatures. Then, it is straightforward to go back to the model equation and substitute the new values received for $I_{ph}$, $I_{01}$, and $I_{02}$. The model equation has to hold for the voltage and current measured, so a new value for $I_{ph}$ can be extracted from it easily by:

$$I_{ph} = I + I_{01}(e^{(V+I \cdot R_s)/V_T n_1} - 1) + I_{02}(e^{(V+I \cdot R_s)/V_T n_2} - 1) + \frac{V+I \cdot R_s}{R_{sh}} + \alpha \frac{V+I \cdot R_s}{R_{sh}} \left(1 - \frac{V+I \cdot R_s}{V_{br}}\right)^{-m}$$

This new value for $I_{ph}$ can be used to extract a new estimate on the illumination. This, in turn, affects a new estimate on the cell temperature (having a new value for the illumination and knowing the wind speed, means the cell temperature has to be modified.). Then, from the new temperature, newer values can be deduced for $I_{ph}$, $I_{01}$, and $I_{02}$, which can be again introduced into the ten-parameters model equation to further modify the value of $I_{ph}$. This iterative process can be either repeated a fixed number of times kept cycling until it converges, or as another option, an estimate of the open circuit voltage can be used, to know when to stop the iterations. Simulations run using Matlab software runs showed consistent convergence; however it is possible that in some cases it would not converge—so a possible way to exit the calculations would be to run a small number of iterations and accept the last value to stop the calculations when the difference between two successive values would be under a threshold, or to use an estimate of the open circuit voltage and check every time if the simulation reached it or to use any other of many possible limiting boundary techniques can be used.

There is therefore a need for a system and a method for improving the efficiency of solar cells, which will enable online assessment of solar cells MPP and perform online "partial meandering" as well as provide solutions to the issues stated above.

SUMMARY OF THE INVENTION

The background art does not teach or suggest a system and a method for improving the operation, utility, and exploitation conditions of solar cell fields which will enable online assessment of solar cells MPP and perform online "partial meandering".

The present invention overcomes these deficiencies of the background art by providing a method and means for monitoring a solar cells array and assessing the MPP of each solar cell, thereby changing an interconnect matrix allowing for at least "partial meandering" of the cells in order to achieve near-maximum power harvesting from the solar cells array.

An embodiment of the present invention is described herein below in which an external camera is used to assess the illumination directly on each solar cell or each solar cells panel of the array of solar cells or solar panels. Once the illumination on each cell/panel is known, a single thermometer and anemometer for the entire solar cells array would enable the measure to give a very good estimate on the temperature of the cells/panels. So the two temperature-dependent parameters $I_{01}$ and $I_{02}$ can be estimated immediately and also $I_{ph}$ can be derived in a straightforward manner from the values supplied by the manufacturer (such as $\alpha_1$) and the (now known) cell temperature. The cell temperature is derived from the illumination, the ambient temperature, and the wind speed by the following formula $$T_{mod} = T_{amb} + \frac{H}{U'_0 + U'_1 \cdot v}$$

where $T_{mod}$ is the solar cell average temperature, $T_{amb}$ is the ambient temperature and v is the wind speed. $U'_0$ and $U'_1$ are constants, and H is the solar irradiance. Therefore, by plotting $H/(T_{mod}-T_{amb})$ against the wind speed v, a straight line should result, of which the slope is $U'_1$ and the intercept is $U'_0$. Some experimental results show that $U'_1$ is about 6.84 and $U'_0$ is about 25.

The solar irradiance may be obtained by the sun's relative inclination angle which is known from astronomical considerations for example by using Woolf's equations which calculates the sun's relative inclination angle according to the time and date as well as the geographical location.

From this, is it possible to see that knowing the illumination (also known as irradiance or radiation) of the solar cells array and the temperature [H, T] is equivalent to knowing the current working point of the cell [I, V], in the respect that when the ten-parameters are known, a complete I/V curve of the working solar cell in question may be drawn in either case.

Also by adding a simple analog module including a photoelectric sensor and a temperature sensor (phototransistor and thermal resistor) to each solar cell, it is possible to approximate each solar cell's MPP.

Once each solar cell's MPP is estimated (either by internal or external measurements), the solar cells may be sorted as meandering, or "partial meandering" in order to achieve better efficiency.

Once the I/P curve estimated for all the cells/panels in the array, assuming the current interconnection is known, the systems' controller may construct an I/P curve for the entire array of solar cells or solar panels, from which, the absolute MPP of the array is known. Thus the maximal power point's current is known, but especially important is the fact that the absolute MPP voltage of the array can be deduced. This voltage can be used as a control of the DC/AC inverter, such that it will show an ideal load towards the field. Then, the MPPT unit can be omitted, which would raise the output of the field by some 3% (as described above).

According to the teaching of the present invention, there is provided a system for improving the operation, utility, and exploitation conditions of solar cell fields, the system including: (a) a solar cells array, including: (i) at least one solar cells panel, including: at least one solar cells chain, including: at least two solar cells; and an interconnect matrix, wherein the interconnect matrix connects at least two of the at least two solar cells into the at least one solar cells chain.

According to further feature of an embodiment of the present invention, the system for improving the operation, utility, and exploitation conditions of solar cell fields further includes: (b) a direct current to alternate current inverter, operatively connected to the solar cells array.

According to further feature of an embodiment of the present invention, the system for improving the operation, utility, and exploitation conditions of solar cell fields further includes: (c) a digital processor operatively connected to the direct current to alternate current inverter.

According to further features of an embodiment of the present invention, the system for improving the operation, utility, and exploitation conditions of solar cell fields further includes: (d) a measuring sub-system for measuring environmental conditions, operatively connected to the digital processor.

According to further features of an embodiment of the present inventions the direct current to alternate current inverter is operatively connected to a power grid.

According to further feature of an embodiment of the present invention, the measuring sub-system includes: (i) a camera for recording of images of the at least two solar cells; and (ii) an anemometer for measuring and for transferring wind data to the digital processor.

According to further features of an embodiment of the present invention, the measuring sub-system further includes: (iii) a thermometer for measuring and for transferring ambient temperature data to said digital processor.

According to further features of an embodiment of the present invention, the digital processor includes: (i) a partial meandering controller, the partial meandering controller being operatively connected to the interconnect matrix.

According to an embodiment of the present invention, the system for improving the operation, utility, and exploitation conditions of solar cell fields, the system includes: (a) a solar cells array including: (i) at least one solar cells panel, including: at least one solar cells chain, including: at least two solar cells; an interconnect device; and a meandered solar cells array, wherein the interconnect device is operatively connected to the at least two solar cells and to the meandered solar cells array.

According to further features of an embodiment of the present invention, the system for improving the operation, utility, and exploitation conditions of solar cell fields further includes: (b) a direct current to alternate current inverter, operatively connected to the solar cells array.

According to furthers features of an embodiment of the present invention, the system for improving the operation, utility, and exploitation conditions of solar cell fields, further includes: (c) a digital processor operatively connected to the direct current to alternate current inverter.

According to furthers feature of an embodiment of the present invention, the system for improving the operation, utility, and exploitation conditions of solar cell fields further includes: (d) a measuring sub-system for measuring environmental conditions, operatively connected to the digital processor.

According to furthers features of an embodiment of the present invention, the direct current to alternate current inverter is operatively connected to a power grid.

According to furthers feature of an embodiment of the present invention, the measuring sub-system includes: (i) a camera for recording of images of the at least two solar cells; and (ii) an anemometer for measuring and for transferring wind data to the digital processor.

According to further features of an embodiment of the present invention, the digital processor includes: (i) a full meandering controller, the full meandering controller is operatively connected to the interconnect device.

Additional objects and advantages of the invention will be set forth in part in the description which follows and, in part, will be obvious from the description, or may be learned by practice of the invention.

BRIEF DESCRIPTION OF THE DRAWINGS

The invention is herein described, by way of example only, with reference to the accompanying drawings, wherein.

In reality, such performance may only be observed when each and every solar cell has its own MPPT and in small arrays, several companies today apply such a technique. But not only is it very expensive to implement, the MPPT unit also still takes its toll.

Figure 10:
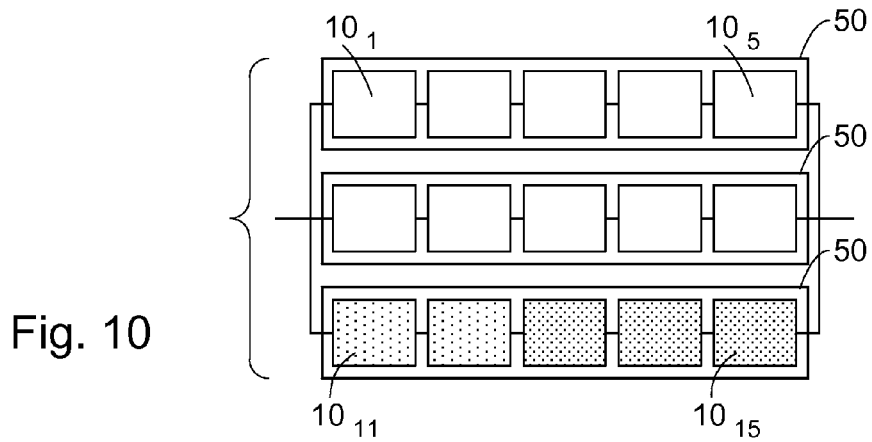

FIG. 10 is a schematic illustration of a "partial meandering" of a partially shaded chain of solar cells, according to the present invention.

Figure 11A:
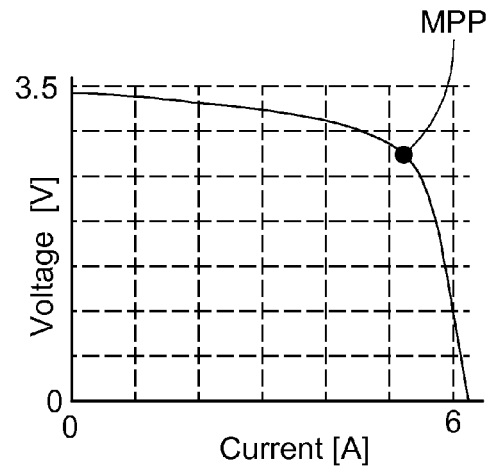

FIG. 11a is a graph of experimental I/V curve results of the simulation of a partially shaded, "partially meandered" chain of solar cells, according to the present invention.

Figure 11B:
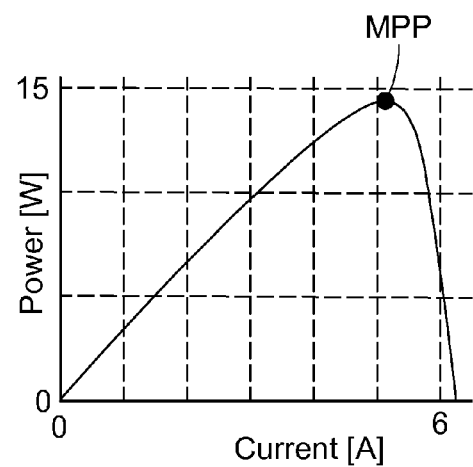

FIG. 11b is a graph of simulation I/P curve results of the performance of a partially shaded, "partially meandered" chain of solar cells, according to the present invention.

Figure 12:
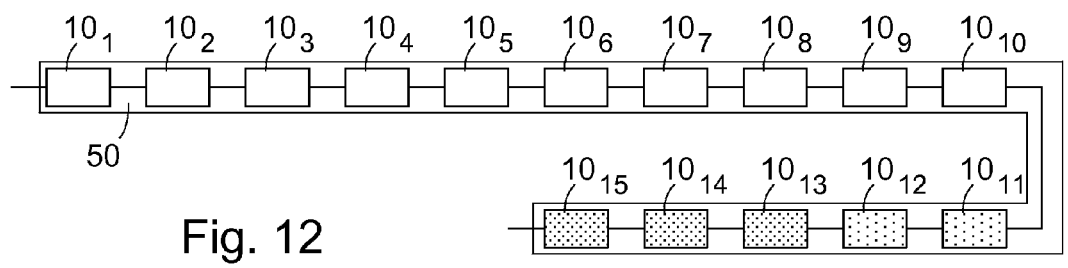

FIG. 12 is a schematic illustration of a partially shaded chain of solar cells, according to the present invention.

FIG. 13a is a graph of simulation IN curve results of the performance of a partially shaded chain of solar cells without the use of bypass diodes, according to the present invention.

FIG. 13b is a graph of simulation I/P curve results of the performance of a partially shaded chain of solar cells without the use of bypass diodes, according to the present invention.

FIG. 14 is an isometric schematic illustration of a solar cells array equipped with a camera, an anemometer, and a thermometer, according to the present invention.

Figure 15A:
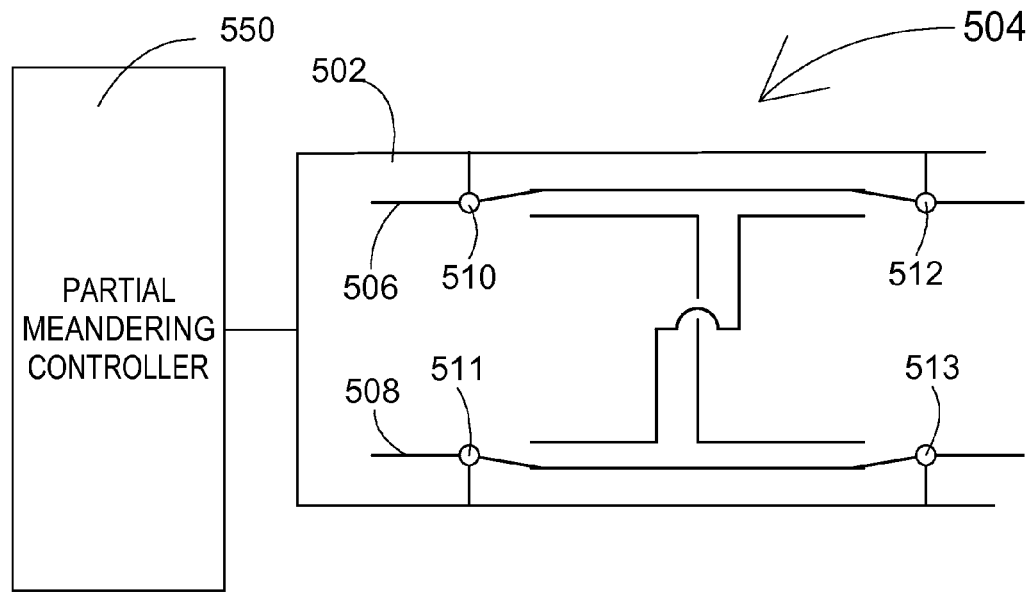

FIG. 15a is a schematic diagram of a single cross relay controlled by a partial meandering controller, according to the present invention.

Figure 15B:
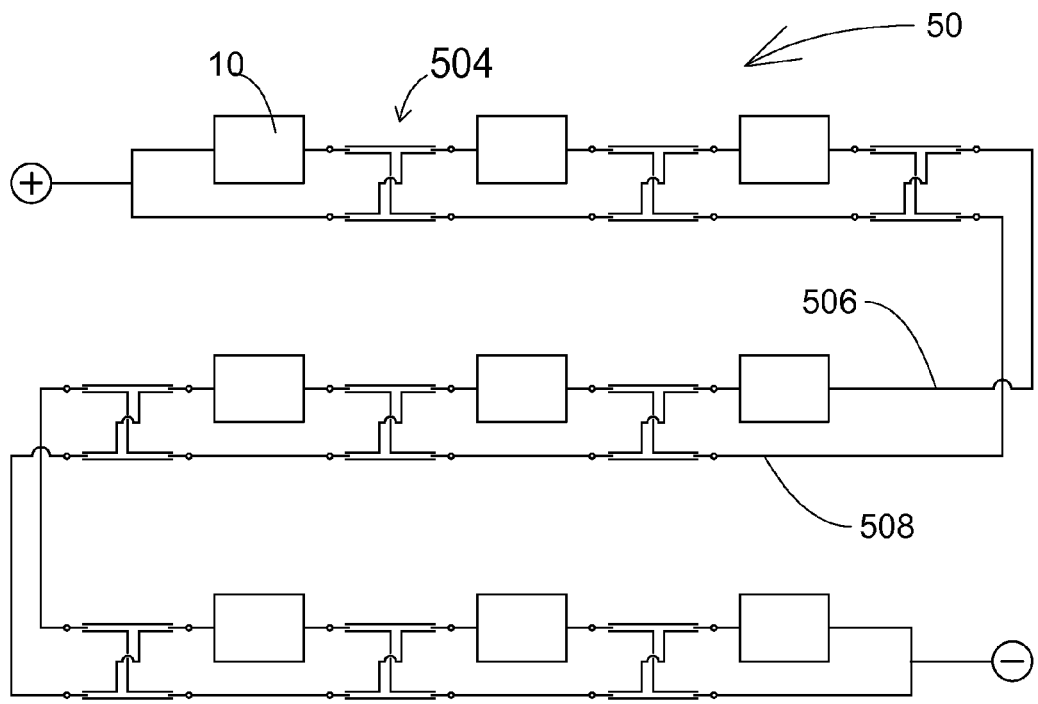

FIG. 15b is a schematic diagram of a solar cells chain equipped with cross relays for use with a partial meandering controller, according to the present invention.

Figure 16:
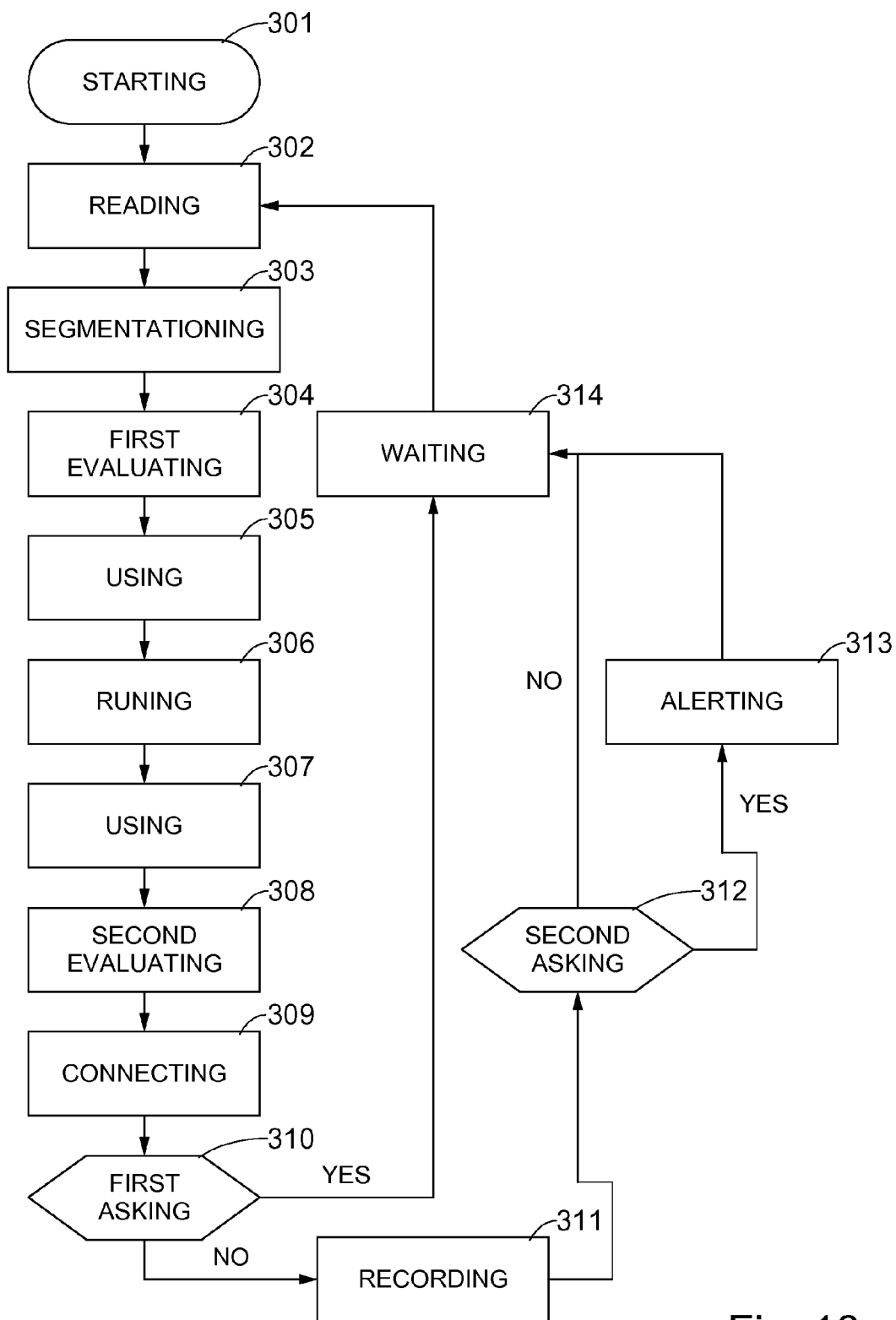

FIG. 16 is a flow chart for a partial meandering controller, according to the present invention.

Figure 17:
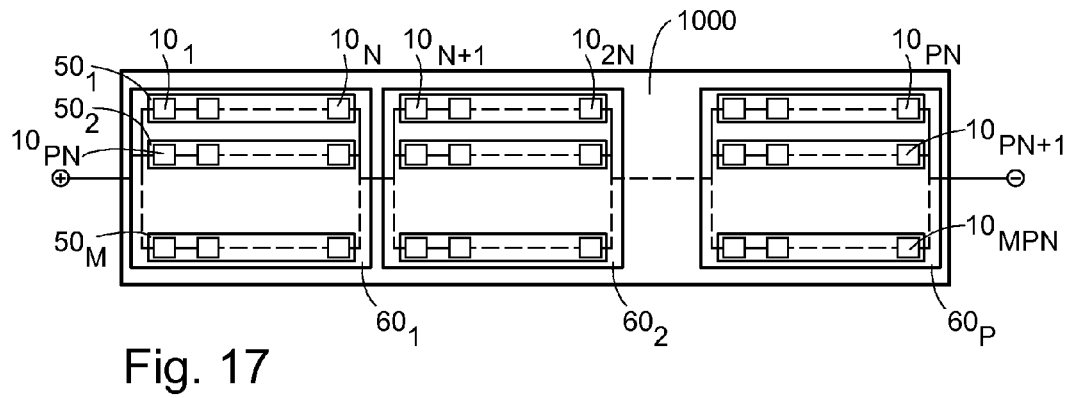

FIG. 17 is a schematic illustration of a full meandering scheme of solar cells array, according to the present invention.

Figure 18A:
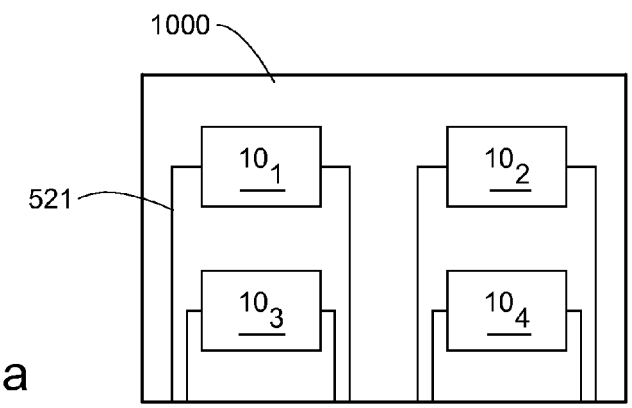

FIG. 18a is a schematic illustration of solar cells array, according to the present invention.

Figure 18B:
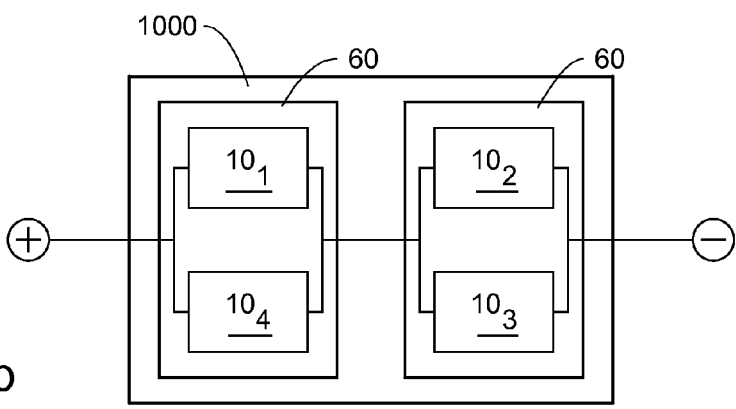

FIG. 18b is a schematic illustration of a full meandering scheme of cells array of four solar cells, according to the present invention.

Figure 18C:
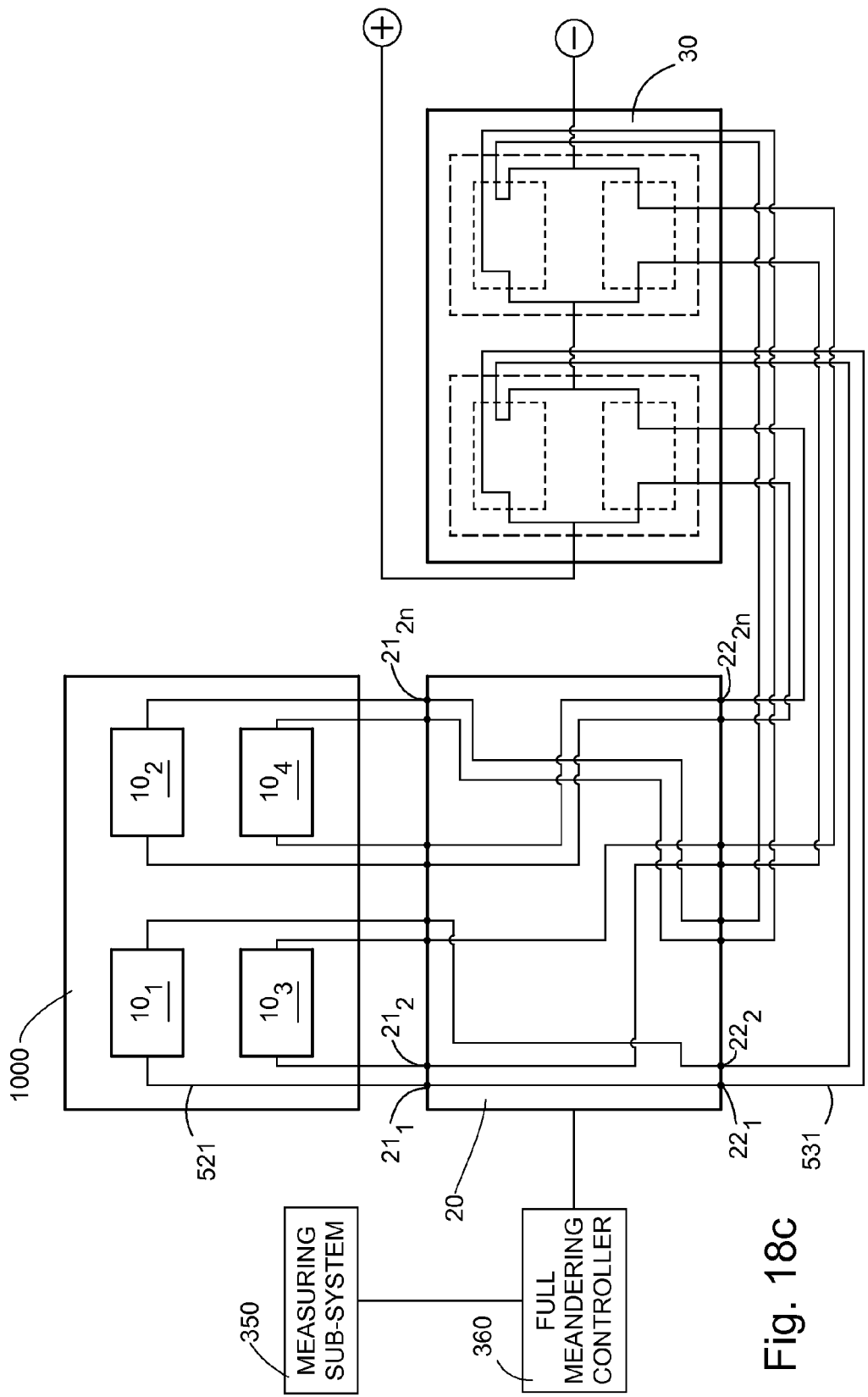

FIG. 18c is a schematic illustration of solar cells array of four solar cells, a meandered solar cells array, and an interconnect device, according to the present invention.

Figure 19:
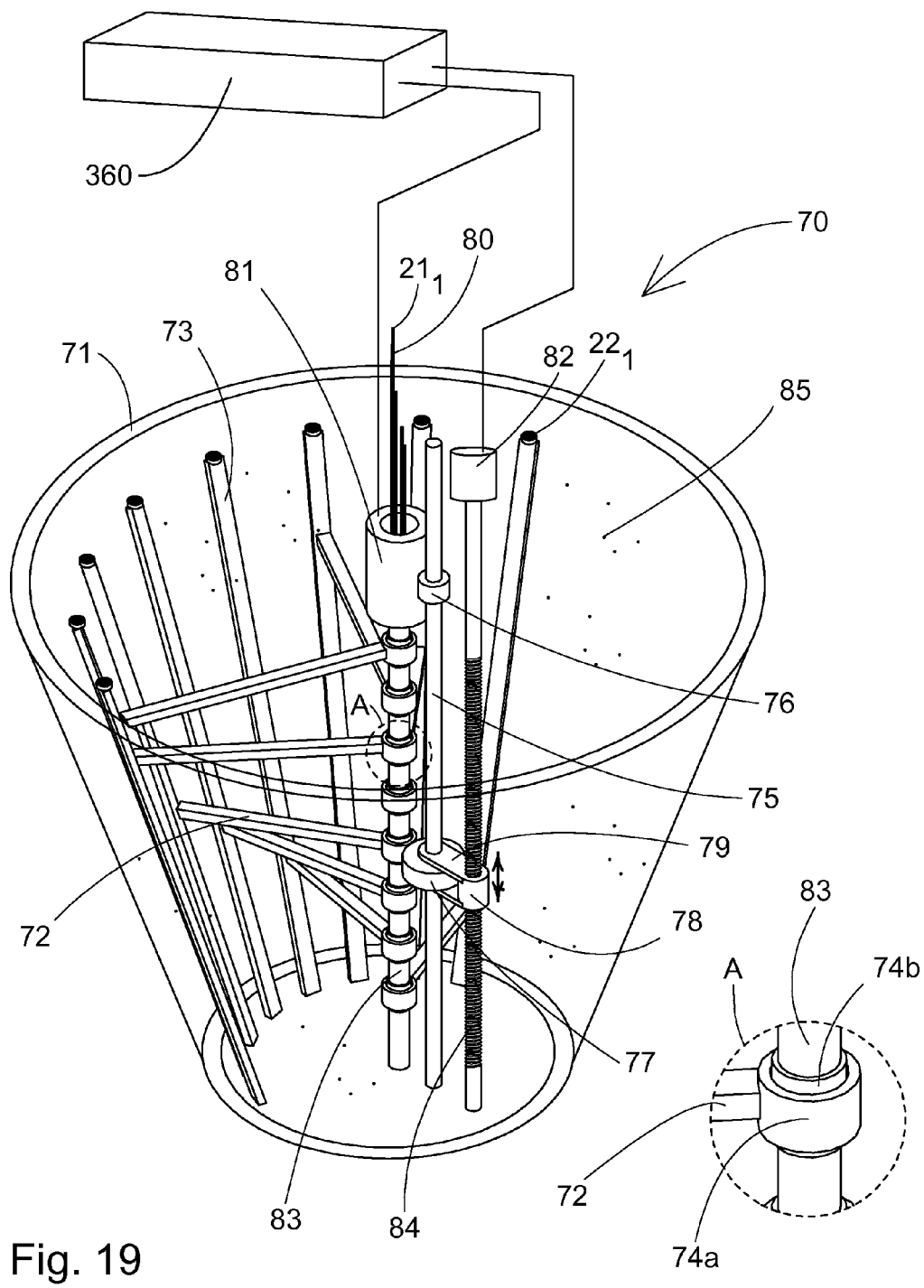

FIG. 19 is an isometric schematic illustration of an interconnection cone, according to the present invention.

Figure 20:
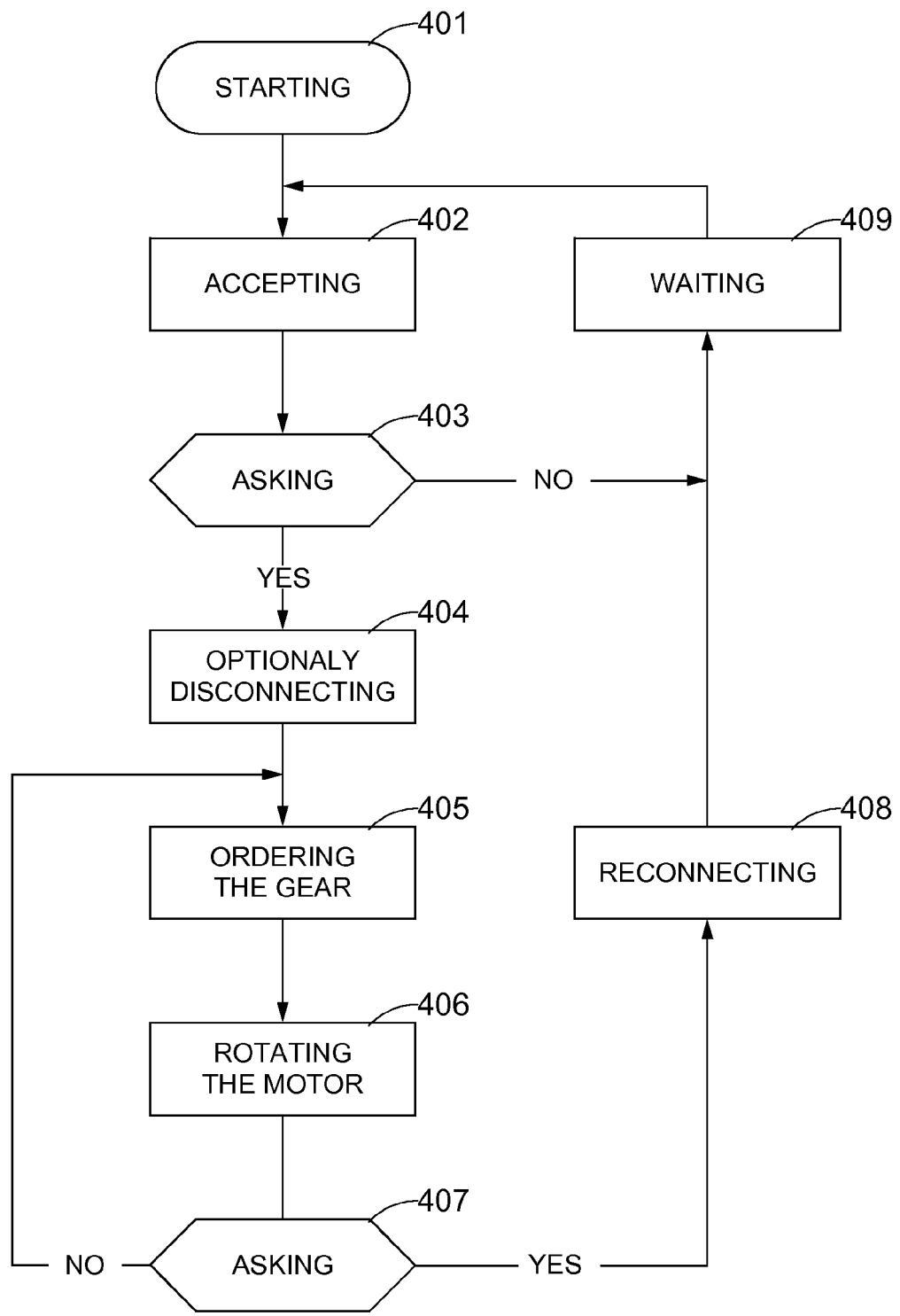

FIG. 20 is a flow chart for a full meandering controller operation, according to the present invention.

DETAILED DESCRIPTION OF EMBODIMENTS

The present invention is of a system and a method for improving the operation, utility, and exploitation conditions of solar cell fields.

The principles and operation of a system and a method for improving the improving the operation, utility, and exploitation conditions of solar cell fields according to the present invention may be better understood with reference to the drawings and the accompanying description.

Before explaining at least one embodiment of the invention in detail, it is to be understood that the invention is not limited in its application to the details of construction and the arrangement of the components set forth in the following description or illustrated in the drawings.

Unless otherwise defined, all technical and scientific terms used herein have the same meaning as commonly understood by one of ordinary skill in the art to which this invention belongs. The materials, dimensions, methods, and examples provided herein are illustrative only and are not intended to be limiting.

Figure 1:
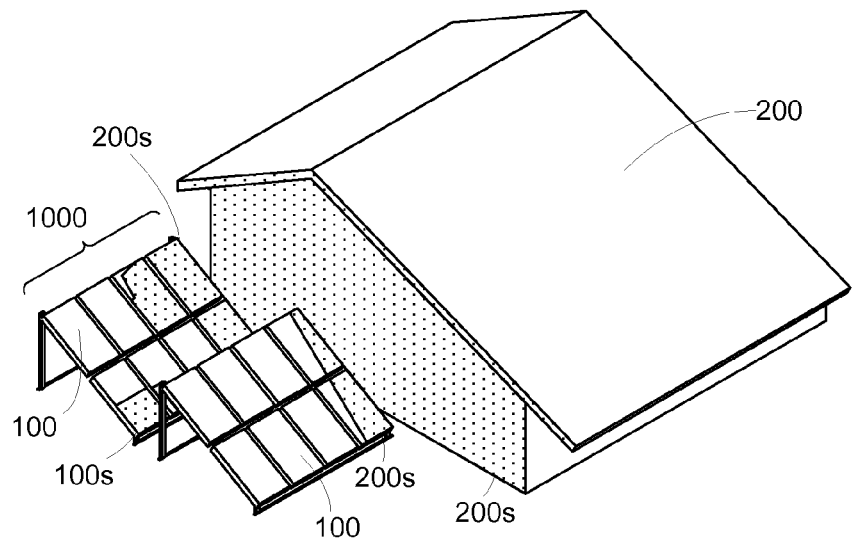
FIG. 1 of the prior art illustrates a solar cells array located near a building with partial shading by the building and shading caused by solar cells panels within the solar cells array.
Figure 2A:
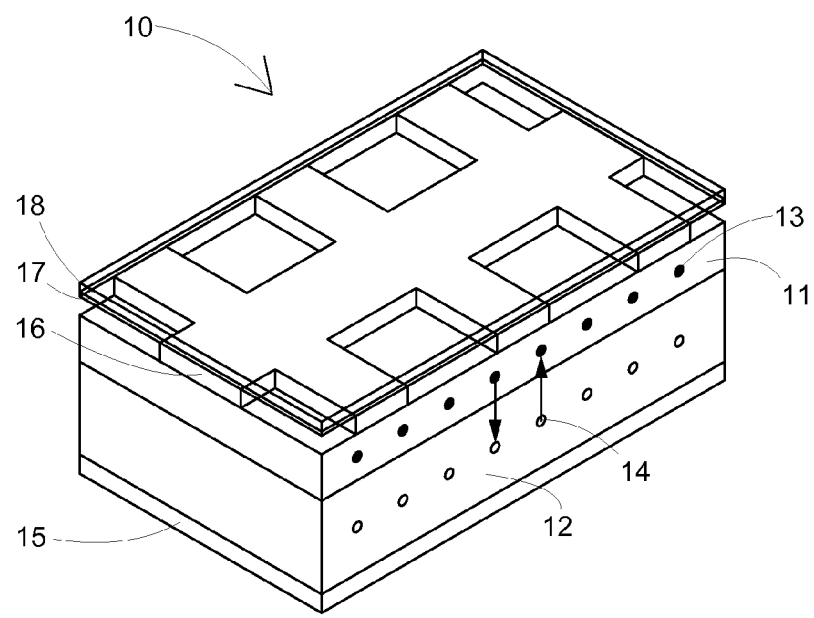
FIG. 2a of the prior art is an isometric schematic illustration of a single solar cell.
Figure 2B:
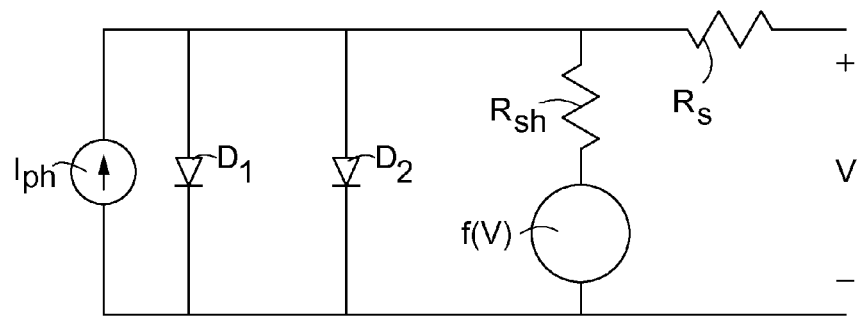
FIG. 2b of the prior art is a schematic electrical representation of a solar cell.
Figure 3A:
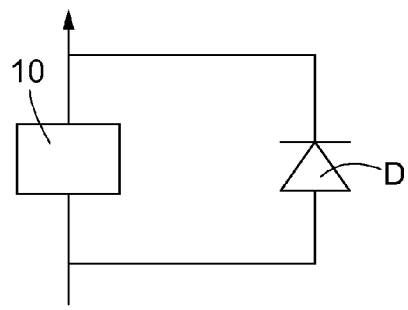
FIG. 3a of the prior art is a schematic electrical representation of a solar cell equipped with a bypass diode.
Figure 3B:
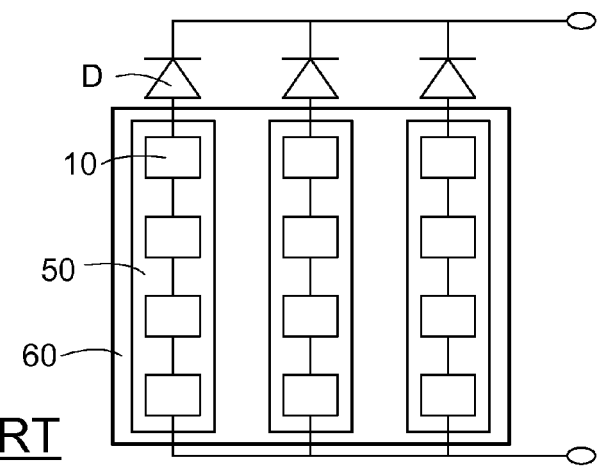
FIG. 3b of the prior art is a schematic electrical representation of a solar cells panel, including a set of solar cells chains, each equipped with a blocking diode.
Figure 3C:
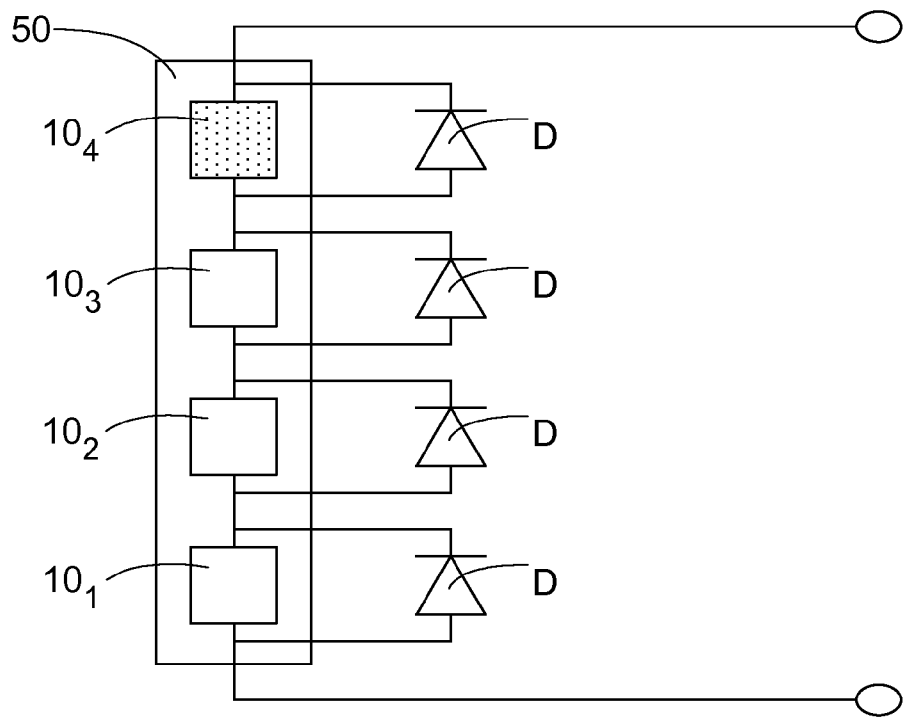
FIG. 3c of the prior art is a schematic electrical representation of a solar cells chain of four solar cells, each equipped with a bypass diode.
Figure 3D:
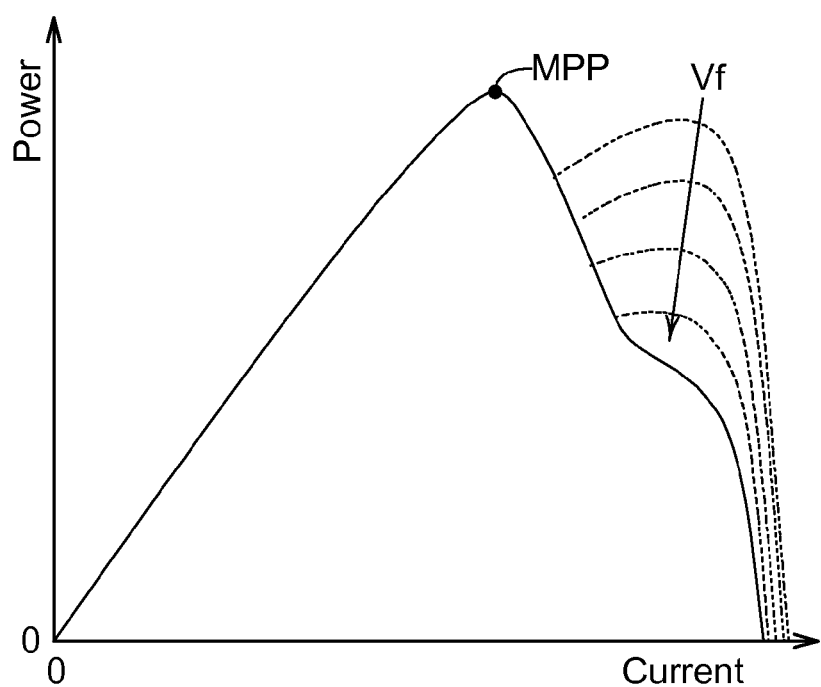
FIG. 3d is a graph of simulation results of the effect of different bypass diodes on the performance of a solar cells chain, according to the present invention.
Figure 4A:
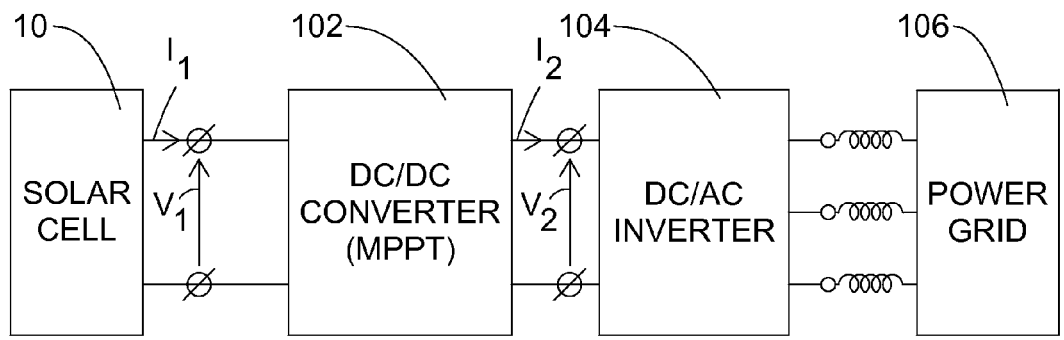
FIG. 4a of the prior art is a schematic block diagram of a system for harvesting solar energy.
Figure 4B:
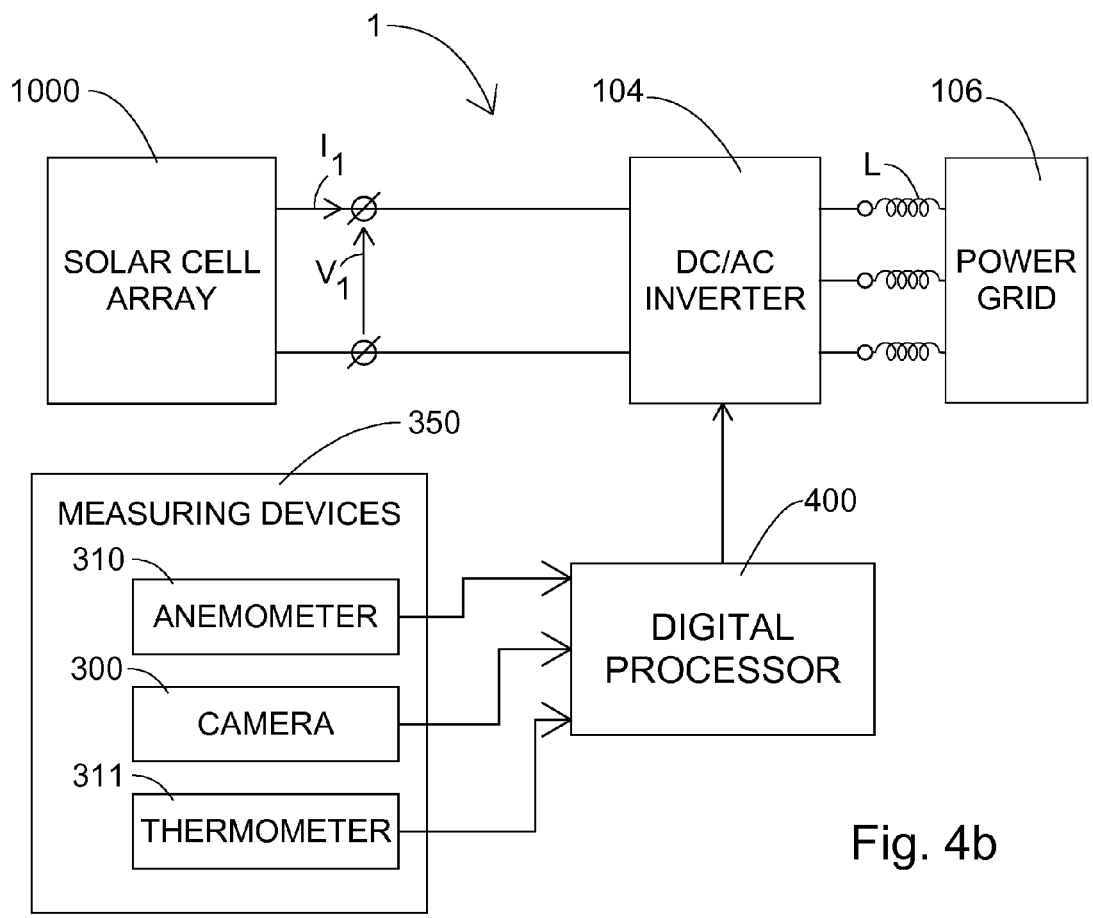
FIG. 4b is a schematic block diagram of a system for improving the operation, utility, and exploitation conditions of solar cell fields, according to the present invention.

The following list is a legend of the numbering of the application illustrations:

1 system for improving the operation, utility, and exploitation conditions of solar cell fields
  10 solar cell
  10'$_i$ $i^{th}$ schematic locations 10$_i$ i$^{th}$ solar cell
10$_{i,j}$ i$^{th}$ solar cell in j$^{th}$ row
11 N-type semiconductor
12 P-type semiconductor
13 free electron
14 free hole
15 back contact
16 front contact
17 anti-reflective coating
18 glass cover
20 interconnect device
21 interconnect device input
21$_i$ i$^{th}$ interconnect device input
22 interconnect device output
22$_i$ i$^{th}$ interconnect device output
30 meandered solar cells array
50 solar cells chain
50$_i$ i$^{th}$ solar cells chain
60 solar cells chains block
60$_i$ i$^{th}$ solar cells chains block
70 conic interconnect device
71 conic interconnect wall
72 input arm
73 output arm
74a input arm ring
74b first motor bar ring
75 second bar
76 second bar first wheel
77 second bar second wheel
78 nut
79 nut arm
80 internal wire
81 first motor
82 second motor
83 first motor bar
84 worm
85 inert gas
100 solar cells panel
100s shading from solar cells panel
102 DC/DC converter
104 DC/AC inverter
106 power grid
200 building
200s shading from building
300 camera
310 anemometer
311 thermometer
312 photoelectric sensor
314 temperature sensor
350 measuring sub-system (for measuring environmental conditions)
360 full meandering controller
400 digital processor
500 interconnect matrix
502 relay control line
504 cross relay
506 first power line
508 second power line
510 first input port
511 second input port
512 first output port
513 second output port
521 solar cells to interconnect device wire
531 interconnect device to meandered solar cells array wire
550 partial meandering controller
600 interconnection cone
1000 solar cells array Referring now to the drawings, FIG. 4b is a schematic block diagram of a system for improving the operation, utility, and exploitation conditions of solar cell fields 1, according to the present invention.

The present figure depicts the use of measuring sub-system 350, including means such as a camera 300, preferably a digital camera, an anemometer 310, and a thermometer 311.

The camera 300 periodically records an image of a solar cell 10 or a solar cells array 1000 (both not shown in the present drawing), and transfers the image to a digital processor 400 for analyzing and controlling the DC/AC inverter 104. The DC/AC inverter 104, in turn, provides the solar cell 10 or the solar cells array 1000 with the correct load and voltage, as would have been provided by the DC/DC converter 102, which is not used in this embodiment of the current invention.

The anemometer 310 measures and transfers wind data to the digital processor 400 too.

The DC/AC inverter 104 receives the output voltage V1 of the solar cell 10 (or solar cells array 1000) and inverts it into alternating current (AC) voltage and delivers it through a set of inductors L to the power grid 106.

Figure 4C:
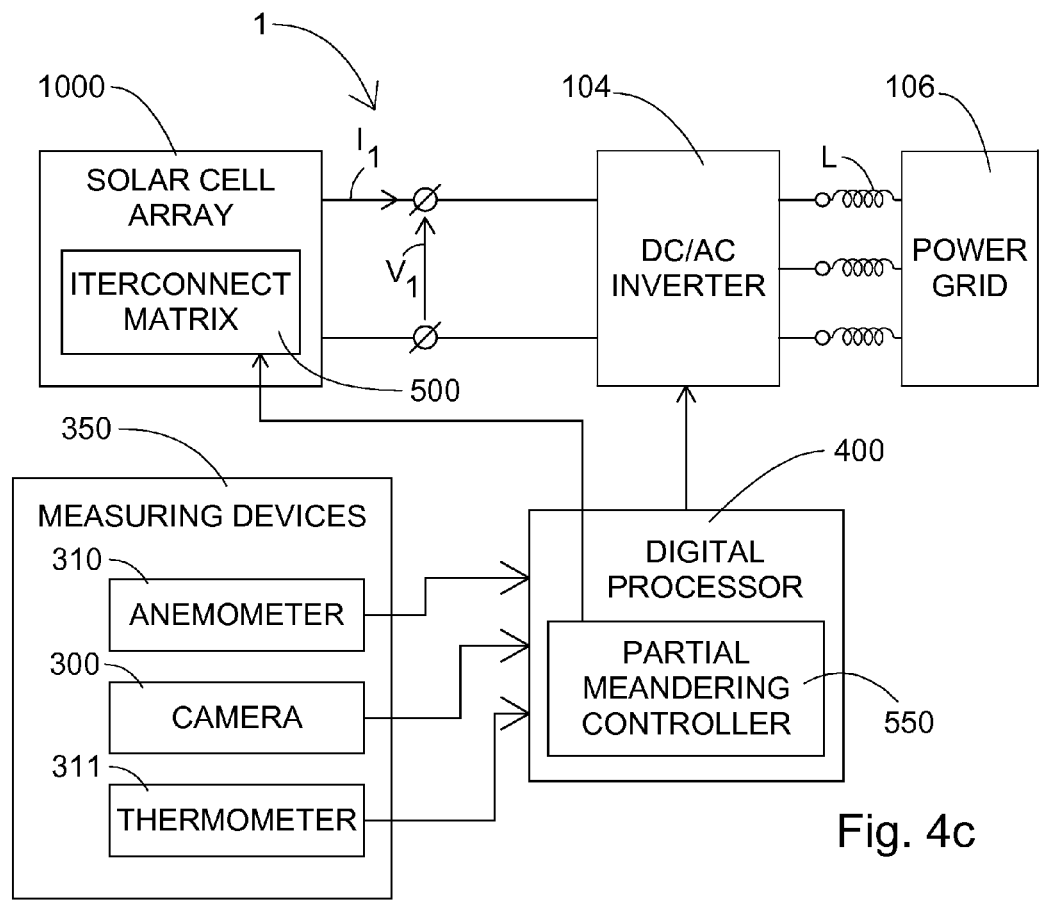
FIG. 4c is a schematic block diagram of a system for improving the operation, utility, and exploitation conditions of solar cell fields, according to the present invention.

FIG. 4c is schematic block diagram of a system for improving the operation, utility, and exploitation conditions of solar cell fields 1, according to the present invention.

In the configuration described in the present figure, a solar cells array 1000 is equipped with an interconnect matrix 500 used for meandering of the solar cells 10, (not shown in the present illustration), to achieve maximum energy harvesting efficiency in cases where solar cells 10 have degraded performance due to factors such as aging, dust presence, and shading. The interconnect matrix 500 is controlled by the partial meandering controller 550, which is part of the digital processor 400.

The present figure depicts the use of measuring sub-system 350, including means such as a camera 300, preferably a digital camera, an anemometer 310, and a thermometer 311.

Figure 5:
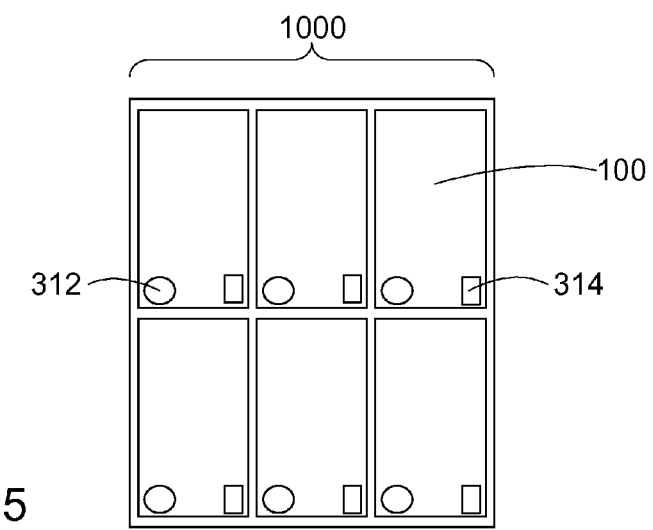
FIG. 5 is a schematic illustration of an array of solar cells panels containing a photoelectric sensor and a temperature sensor, according to the present invention.

FIG. 5 is a schematic illustration of a solar cells array 1000 containing several solar cells panels 100 each of which contains a photoelectric sensor 312 and a temperature sensor 314, according to the present invention.

The photoelectric sensor 312 and the temperature sensor 314 are used to measure the illumination (H) and the temperature (T), respectively of the solar cells panel 100.

These measurements [H, T] can be used instead of the [I, V] measurements to evaluate the solar cell 10, solar cells panel 100 or solar cells array 1000 I/V curve and I/P curve and from there, to find the maximum power point (MPP) of the solar cell 10, solar cell panels 100 or solar cells array 1000. Furthermore, these measurements [H, T] can be incorporated in the solar cell structure during their fabrication.

Figures 6A, 6B:
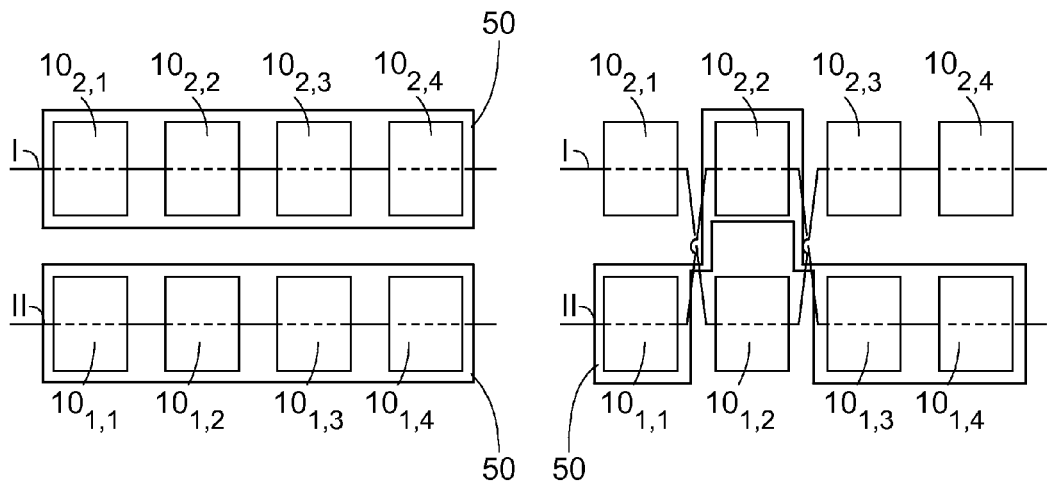
FIG. 6a is a schematic illustration of two chains of solar cells, according to the present invention.
FIG. 6b is a schematic illustration of two chains of solar cells, according to the present invention.

FIG. 6a is a schematic illustration of two solar cell chains 50, according to the present invention.

In the present illustration, the solar cells 10 are connected according to their physical location; a first solar cell in first row 10$_{1,1}$, a second solar cell in first row 10$_{1,2}$, a third solar cell in first row 10$_{1,3}$ and a fourth solar cell in first row 10$_{1,4}$ are connected in series in a first row and a first solar cell in second row 10$_{2,1}$, a second solar cell in second row 10$_{2,2}$, a third solar cell in second row 10$_{2,3}$ and a fourth solar cell in second row 10$_{2,4}$ are connected in series in a second row.

FIG. 6b is a schematic illustration of two chains 50 of solar cells 10, according to the present invention.

In the present illustration, the solar cells 10 are connected according to their illumination levels. The solar cells 10 are now connected as follows: a first solar cell in first row 10$_{1,1}$, a second solar cell in second row 10$_{2,2}$, a third solar cell in first row 10$_{1,3}$ and a fourth solar cell in first row 10$_{1,4}$ are serially connected in one chain and a first solar cell in second row $10_{2,1}$, a second solar cell in first row $10_{1,2}$, a third solar cell in second row $10_{2,3}$ and a fourth solar cell in second row $10_{2,4}$ are connected in series in a another chain.

To simplify the illustration, only one chain 50 is marked.

Figure 7:
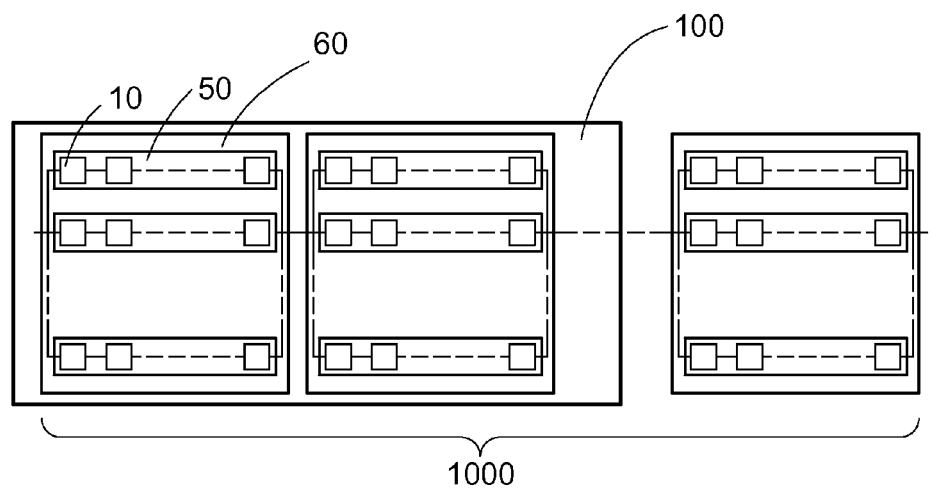
FIG. 7 is a schematic illustration of solar cells array, according to the present invention.

FIG. 7 is a schematic illustration of a solar cells array 1000, according to the present invention.

According to the present invention, there is a need to arrange the solar cells 10 into solar cells chain 50 and solar cells chains blocks 60, which can be part of the panels 100 according to their illumination and temperature levels.

Using partial meandering, the solar cells chains 50 are grouped into solar cells chains blocks 60 to achieve near ideal performance.

Figure 8A:
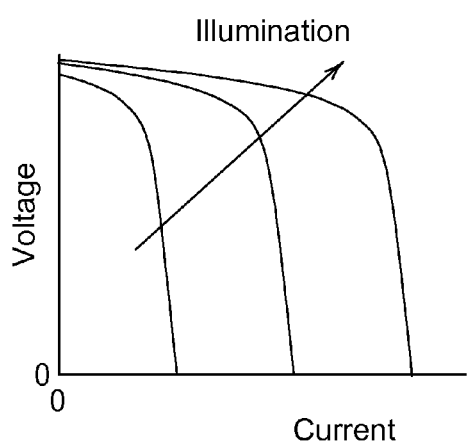
FIG. 8a is a graph of several I/V curves of a solar cells with changing illumination levels, according to the present invention.

FIG. 8*a* is a graph of several I/V curves of a solar cell 10 with changing illumination levels, according to the present invention.

Each line in the graph represents a solar cell 10 I/V curve associated with a specific illumination level.

From this graph it is possible to see that there are no intersections of the graphs linked to specific illumination levels. This leads to the fact that given the open-circuit (current is 0 Amp) measurement and short-circuit (voltage is 0 V), together with the known ten-parameters of a solar cell 10, there is only one matching I/V curve and its MPP can be deduced from the curve.

Figure 8B:
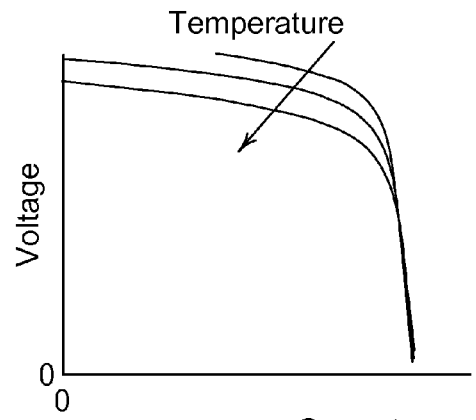
FIG. 8b is a graph of several IN curves of a solar cell with changing temperature levels, according to the present invention.

FIG. 8*b* is a graph of several I/V curves of a solar cell 10 with changing temperature levels, according to the present invention.

Each line in the graph represent a solar cells' 10 I/V cure associated with a specific temperature level.

From this graph it is possible to see that there is only one intersection point of the graphs linked to specific temperature levels. This leads to the fact that given the open-circuit (current is 0 Amp.) measurement and short-circuit (voltage is 0 V), together with the known 10 parameters of a solar cell 10, there is only one matching I/V curve and it's MPP can be deduced from the curve.

From these two graphs (FIGS. 8*a* and 8*b*), it is possible to deduce that knowing the values of the illumination (H) and temperature (T), it is possible to deduce a solar cell's I/V curve without any current or voltage measurements.

Figure 9A:
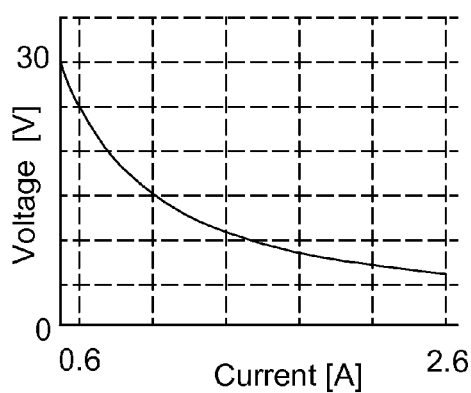
FIG. 9a is a graph of simulation I/V curve results of an "ideal" performance of a partially shaded chain of solar cells, according to the present invention.

FIG. 9*a* is a graph of simulation I/V curve results of an "ideal" performance of a partially shaded solar cells chain 50 (shown in FIG. 12), according to the present invention.

"Ideal" performance is achieved by using a DC/DC converter 102 (shown in FIG. 4*a*), for each solar cell 10 in the chain.

Figure 9B:
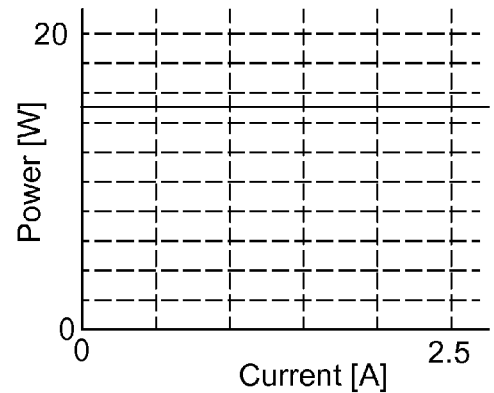
FIG. 9b is a graph of simulation PP curve results of an "ideal" performance of a partially shaded chain of solar cells, according to the present invention.

FIG. 9*b* is a graph of simulation PP curve results of an "ideal" performance of a partially shaded solar cells chain 50 (shown in FIG. 12), according to the present invention.

From FIGS. 9*a* and 9*b*, it is possible to see that the most power that can be harvested by this configuration is approximately 15 W, at any load current (up to 2.6 A)

FIG. 10 is a schematic illustration of a "partial meandering" of a partially shaded solar cells chain 50 (shown in FIG. 12), according to the present invention.

The solar cells 10 in the partially shaded solar cells chain 50 are grouped into three solar cells chains 50 of five solar cells 10 according to their illumination levels. Solar cells $10_{11}$-$10_{15}$ are grouped together since they are all partially shaded, in order to minimize their effect on the fully illuminated solar cells $10_1$-$10_{10}$.

FIG. 11*a* is a graph of simulation I/V curve results of the performance of a partially shaded, "partially meandered" solar cells chain 50 (shown in FIG. 10), according to the present invention.

The MPP is marked by the dot on the UV curve.

FIG. 11*b* is a graph of simulation I/P curve results of the performance of a partially shaded, "partially meandered" solar cells chain 50, according to the present invention.

The MPP is marked by the dot on the I/V curve.

From FIGS. 11*a* and 11*b* it is possible to see that with "partial meandering" of the partially shaded solar cells chain 50 as performed in FIG. 10, the maximum power that can be harvested from the solar cells chain 50 is approximately 14.7 W which is very close to the "ideal" performance without the use of a DC/DC converter 102 per solar cell.

FIG. 12 is a schematic illustration of a partially shaded solar cells chain 50, according to the present invention.

The solar cells chain 50 is composed of 15 identical solar cells 10 of which two ($10_{11}$ and $10_{12}$) are one-third shaded and three ($10_{13}$, $10_{14}$ and $10_{15}$) are two-thirds shaded. The shading degrades the performance of the shaded cells causing a drop in performance for the entire solar cells chain 50.

FIG. 13*a* is a graph of simulation I/V curve results of the performance of a partially shaded solar cells chain 50 (shown in FIG. 12) without the use of bypass diodes, according to the present invention.

FIG. 13*b* is a graph of simulation I/P curve results of the performance of a partially shaded solar cells chain 50 (shown in FIG. 12) without the use of bypass diodes, according to the present invention.

The simulations and their results hereinafter were performed using Matlab and Simulink software and are using the well-known "ten-parameter" model.

From these curves it is possible to see that both curves have local minima and maxima; possibly causing the MPP calculations to converge on to a local maximum rather than the global maximum, leading to loss of energy that can be harvested should the MPP calculations converge to the global maximum.

When using an MPPT 102 for each solar cell 10 in the solar cells chain 50, the I/V and PP curves of FIGS. 9*a* and 9*b*, respectively, yield. This is the maximum output power of the solar cells chain 50. It is possible to see that without the MPPTs 102, the maximum power point (MPP) is at 7.2 W, while with the MPPTs 102, the MPP is at 15 W. However, as shown earlier, the use of an MPPT 102 per solar cell/panel is not economically viable for large solar cell arrays.

By symmetrically separating the solar cells 10 into groups as described in FIG. 10, where the shaded solar cells are grouped together, their weakened performance does not interfere with the normal operation of the non-shaded solar cells.

The result of this reconfiguration of the solar cells 10 is presented in FIGS. 11*a* and 11*b*, from which it is possible to see that the power harvested from the solar cells 10 is about 14.5 W which is very close to the "ideal" power harvested using an MPPT 102 per solar cell 10.

In order to achieve the "ideal" arrangement of the solar cells 10, an interconnect matrix 500 needs to be implemented within the solar cells array 1000. Such an interconnect matrix 500 would require any number between O(n log 2n) up to O(n2) relays (n being the number of solar cells in the array), which is not economical.

From FIGS. 13*a* and 13*b* it is possible to see that there are more than one local maximum in the PP curve and that the absolute maximum of power that can be harvested from the configuration presented in FIG. 12 is approximately 7.4 W.

FIG. 14 is an isometric schematic illustration of a solar cells array 1000 equipped with measuring sub-system 350 such as a camera 300 an anemometer 310 and a thermometer 311, according to the present invention.

The camera 300 is used to provide an image of the solar cells array 1000 that a digital processor 400 (not shown in the present illustration) can to detect shade, by analysis, on various parts of the solar cells array 1000 and to control the DC/AC inverter 104 (not shown in the present illustration).

The anemometer 310 measures the wind speed and direction and the thermometer 311 measures the ambient temperature, and both feed the measurements to the digital processor 400 (not shown in the present illustration) for additional data in the calculations for controlling the DC/AC inverter 104 (not shown in the present illustration).

The thermometer 311 is needed when there is no temperature sensor 314 embedded within the solar cell panels 100 of the solar cells array 1000. When there is a temperature sensor 314 embedded within the solar cell panels 100, the thermometer 311 can be omitted.

FIG. 15a is a schematic diagram of a single cross relay 504 controlled by a partial meandering controller 550, according to the present invention. This is only an example of the possibility to perform meandering. Other solutions could also be envisaged.

The cross relay 504 has two input ports and two output ports. The cross relay 504 has two states: pass-through and cross-through. In the pass-through state, the first input port 510 is connected to the first output port 512 and the second input port 511 is connected to the second output port 513. In the cross-through state, the first input port 510 is connected to the second output port 513 and the second input port 511 is connected to the first output port 512.

The partial meandering controller 550 is connected to the cross relay 504 by means of a relay control line 502, or by means of wireless control, which defines the state of the cross relay 504.

FIG. 15b is a schematic diagram of a solar cells chain 50 equipped with cross relays 504 for use with a partial meandering controller 550, (not shown in the present drawing), according to the present invention.

The solar cells chain 50 is equipped with cross relays 504 before and after each solar cells 10, (except for the first and last solar cells 10 in the solar cells chain 50).

This configuration enables the partial meandering controller 550 to split the solar cells chain 50 into two separate solar cells chains 50 by setting the states of each cross relay 504. For example, if the partial meandering controller 550 decides that the second and fourth solar cells 10 in the solar cells chain 50 need to be on a separate solar cells chain 50, it would set the cross relays 504 before and after the second and fourth solar cells 10 to the cross-through state and the rest of the cross relays 504 to their pass-through state.

The partial meandering controller 550 is connected to each cross relay 504 by a dedicated relay control line 502.

FIG. 16 is a flow chart for a partial meandering controller 550, according to the present invention.

The partial meandering controller 550 starts its operation at the "starting stage" (stage 301) upon power up of the partial meandering controller 550. Following that, the partial meandering controller 550 moves to the "reading stage" (stage 302) where it reads a picture from the camera 300, wind speed from the anemometer 310 and temperature data from the temperature sensors 314 temperature sensors.

Then, the partial meandering controller 550 moves to the "segmentationing" stage (stage 303) where it segments the picture and evaluates the illumination on each solar cells panel 100.

The next stage is the "first evaluating" stage (stage 304) where the partial meandering controller 550 evaluates each solar cells panel's 100 average temperature according to the temperature, illumination and wind speed readings acquired in the "reading stage" (stage 302).

After the evaluation is done, the partial meandering controller 550 moves to the "using" stage (stage 305) where for each solar cells panel 100 it uses the solar cells panel's 100 temperature to offset $I_{ph}$, $I_{01}$ and $I_{02}$.

The next stage is the "running stage" (stage 306) in which the partial meandering controller 550 runs N-R on the ten-parameter model in order to find the MPP of each solar cells panel 100, or use any other method.

Following that, the partial meandering controller 550 moves to the "using stage" (stage 307) where the partial meandering controller 550 uses meandering to divide the solar cells panels 100 into two groups by their maximum powers.

Now the partial meandering controller 550 goes into the "second evaluating" stage (stage 308) in order to evaluate the solar cells array 1000's MPP and control the DC/AC inverter 104 to present Vmpp to the solar cells array 1000 in order to achieve maximum power.

Once the evaluation of the MPP of the solar cells array 1000 is complete, the partial meandering controller 550 moves to the "connecting" stage (stage 309) in which it connects the best performing solar cells panels 100 in the primary solar cells chain 50 and the weaker ones in the secondary solar cells chain 50.

After this, the partial meandering controller 550 moves to the "first asking stage" (stage 310) in which it evaluates if the solar cells array 1000 output is comparable with the evaluation. If it is, then it moves to the "waiting stage" (stage 314). If not, it moves to the "recording stage" (stage 311) where it records the time and moves to the "second asking stage" (stage 312).

At the "second asking stage" (stage 312), the partial meandering controller 550 checks if the "first asking stage" (stage 310) happens for e.g., a fixed amount of time that could be preset by the user, e.g., a month. In it is, then the partial meandering controller 550 moves to the "alerting stage" (stage 313) where it alerts the operator of the solar cells array 1000 to retest the solar cells panels' 100 respective parameters as they may change as time goes by due to aging, malfunctions etc.

If the answer to the "second asking stage" (stage 312) is negative, then the partial meandering controller 550 moves to the "waiting stage" (stage 314) where the partial meandering controller 550 waits for a preset amount of time before starting a new iteration at the "reading stage" (stage 302).

While the invention has been described with respect to a limited number of embodiments, it will be appreciated that many variations, modifications and other applications of the invention may be made.

FIG. 17 is a schematic illustration of a full meandering scheme of solar cells array 1000, according to the present invention.

Using full meandering, the solar cells array 1000 is arranged into solar cells chains 50 which are grouped into solar cells chains blocks 60 in order to achieve near optimal performance. Unlike the geometrical arrangement of the solar cells 10 in the solar cells array 1000, the full meandering scheme, which is a fixed scheme, is determined by allocation of the solar cells 10 to the desired positions in the scheme, by means of switching.

Full meandering means the sorting of the solar cells 10 by their corresponding maximal power outputs and then arranging them in a scheme as shown in the present illustration, in which the solar cells 10 are arranged in a serpentine way from the leftmost upper best solar cells $10_1$ to the right to solar cells $10_{PN}$ and back to the left through solar cells $10_{PN+1}$ to the 2PN weaker solar cells 10, the solar cells $10_{2PN}$ and back until the end of the solar cells array 1000 at solar cells $10_{MPN}$.

This scheme ensures that in the P blocks/M strings arrangement, an optimal path for the current is always present. Therefore, The I/V curve of a full meandered array doesn't have a local maxima but rather looks much like a normal huge single cell I/V curve. In addition, the problem of weak cells and hot spots is averted in such a scheme, which extracts the maximal possible current of the interconnection.

FIG. 18a is a schematic illustration of solar cells array 1000 of four solar cells 10, according to the present invention.

The solar cells array 1000 depicted in the present illustration describes a solar cells array 1000 comprising four solar cells 10 (as an example only). The solar cells 10 are shown in their physical location and each solar cell 10 is equipped with two solar cells to interconnect device wires 521.

FIG. 18b is a schematic illustration of a full meandering scheme of cells array 1000 of four solar cells 10, according to the present invention.

The solar cells array 1000 described in the present illustration are arranged by full meandering according to their MPP values (so that the MPP of the first solar cell $10_1$ is the highest followed by the second solar cell $10_2$, the third solar cell $10_3$ and the fourth solar cell $10_4$ has the lowest MPP).

The first solar cell $10_1$ and the fourth solar cell $10_4$ are grouped into one solar cells chains block 60 and the second solar cell $10_2$ and the third solar cell $10_3$ are grouped into another solar cells chains block 60.

FIG. 18c is a schematic illustration of solar cells array 1000 of four solar cells 10, a meandered solar cells array 30 (a full meandering scheme), and an interconnect device 20, according to the present invention.

A solar cells array 1000 is connected to an interconnect device 20 via solar cells 10 to interconnect device wires 521. From the interconnect device 20, the meandered solar cells array 30 is connected via interconnect device to meandered solar cells array wires 531.

Each solar cell $10_i$ in the solar cells array 1000 has two solar cells to interconnect device wires 521 which connect to the interconnect device 20. Each interconnect device wire 521 is rigidly connected to an $i^{th}$ interconnect device input $21_i$.

The meandered solar cells array 30 is equipped with an $i^{th}$ schematic locations $10'_i$ according to a predefined arrangement of solar cells chains 50 and solar cells chains blocks 60 with each virtual location connecting to the interconnect device 20 using two interconnect device to meandered solar cells array wire 531.

Each interconnect device to meandered solar cells array wire is rigidly connected to an $i^{th}$ interconnect device output $22_i$.

In the private case shown in the present illustration, the solar cells $10_i$ are allocated to the schematic locations $10'_i$ according to the desired state according to FIG. 18b, as shown in Table 1.

TABLE 1

| | |
|---|---|
| solar cell $10_1$ | schematic locations $10'_1$ |
| solar cell $10_2$ | schematic locations $10'_2$ |
| solar cell $10_3$ | schematic locations $10'_4$ |
| solar cell $10_4$ | schematic locations $10'_3$ |

The interconnect device 20 is capable of connecting any one interconnect device input 21 to any one interconnect device output 22 in order to rearrange the solar cells 10 into their virtual location in the meandered solar cells array 30.

The interconnect device 20 is activated and controlled by a full meandering controller 360, which receives data from the measuring sub-system 350.

FIG. 19 is an isometric schematic illustration of an interconnection cone 70, according to the present invention.

The interconnection cone 70 is one form of application of the interconnect device 20, among several practical options for dynamic switching.

The details show in the small circle marked A are shown magnified in the circle at the lower right hand end of the present illustration page.

The interconnection cone 70 includes a conical cylinder having a conic interconnect wall 71, shown in the present illustration as transparent, containing an inert gas 85 which is designated to prevent electrical sparks and undesired current conduction. The interconnection cone 70 is sealed to prevent any leakage of the inert gas 85, if necessary by means of seals, which are not shown in the present illustration.

Interconnection cone 70 has a number, suitable for switching purposes, of interconnect device inputs $21_i$ and interconnect device outputs $22_i$. The dynamic switching is performed by creating contact between the desired input arm 72 and output arm 73.

Each output arm 73 is connected to an interconnect device output 22. Each input arm 72 is fed with power supply through a chain of elements, with each element in electrical contact with the subsequent element. The chain of elements includes, in the following order, an $i^{th}$ interconnect device input $21_i$, an internal wire 80, a first motor bar ring 74b, an input arm ring 74a, and the input arm 72 itself. The electrical contact between the input arm ring 74a and a first motor bar ring 74b can be direct or by means of brush hairs, not shown in the present illustration.

The first motor bar rings 74b are disposed along a first motor bar 83, which is composed, at least for part of its external surface, of a non-conductive material.

The internal wires 80 go through the first motor bar 83, and each one of them is connected to one of the first motor bar rings 74b.

A first motor 81 rotates a second bar first wheel 76, which is connected and transmits rotational movement to a second bar 75, which is also connected to a second bar second wheel 77.

According to another embodiment, the first motor 81 directly rotates the second bar 75, and in this case there is no need for a second bar first wheel 76.

The second bar second wheel 77, when it is in contact with a specific input arm ring 74a, rotates the input arm ring and thus rotates the input arm 72 connected to the ring. Determining which input arm ring 74a is in contact with the second bar second wheel 77 is done by means of nut 78, which is connected to nut arms 79, which encompass the second bar second wheel 77.

Nut 78 is linearly moved by a worm 84, which is rotationally moved by a second motor 82.

The first motor 81 and the second motor 82 are harnessed to support points, not shown in the present illustration, and are controlled by a full meandering controller 360.

The full meandering controller 360 can replace the partial meandering controller 550, as a component of the digital processor 400, both of which were described with regard to FIG. 4c.

The conic structure enables good contact, which makes use of gravitational forces, between the input arms 72 and the output arms 73, which are on the internal side of the cylindrical part of the conic interconnect wall 71.

The embodiments described above are exemplary only and other embodiments may be available such as with having each input arm 72 and output arm 73 be double arms such that each double arm conducts two currents rather than a single current with single arms.

Another option for transferring the electrical from the internal wires 80 to the input arms 72 is by directly connecting the internal wires 80 to the input arms 72. This would require that the input arms 72 will not be able to rotate more than 360 degrees in order to avoid tangling and breakage of the internal wires 80.

FIG. 20 is a flow chart for a full meandering controller 360, according to the present invention.

Note: all of the physical element numbers mentioned in the description of the present illustration are shown in previous illustrations.

The process demonstrated in the present flow chart is based on the structure of an interconnection cone 70. When a different structure of interconnect device 20 is used, the process is adapted to its shape.

The full meandering controller 360 starts its operation at the "starting stage" (stage 401) upon power up of the full meandering controller 360.

Following that, the full meandering controller 360 moves to the "accepting stage" (stage 402) where it accepts the MPP value vector (that contains the MPP values of the solar cells 10 in the solar cells array 1000) and sorts it from high to low.

The next stage is the "first asking stage" (stage 403) where the full meandering controller 360 evaluates the need for an interconnect change. If there is no need for an interconnect change, the full meandering controller 360 moves to the "waiting stage" (stage 409). Otherwise, it moves to the "optionally disconnecting stage" (stage 404).

In the "optionally disconnecting stage" (stage 404) the full meandering controller 360 may optionally disconnect the power grid 106.

Following that, the full meandering controller 360 moves to the "ordering stage" (stage 405) in which it orders the second motor 82 to connect the second bar second wheel 77 to a proper input arm ring 74a.

The following stage is the "rotating the motor stage" (stage 406) in which the full meandering controller 360 causes the first motor 81 to rotate, for connecting a proper solar cell 10$_i$ to the appropriate location 10'$_i$, by connecting a proper input arm 72 to a proper output arm 73, and repeats that procedure for the second solar cells to interconnect device wires 521 of the solar cell 10$_i$.

Next, the full meandering controller 360 moves to the "second asking stage" (stage 407) where the full meandering controller 360 checks if the input arms 72 are at their appropriate locations. If it is not done, the full meandering controller 360 moves back to the "ordering stage" (stage 405) in order to finish the interconnection rearrangements. If it is done, the full meandering controller 360 moves to the "reconnecting stage" (stage 408) where it reconnects the power grid 106 in case it was opened at the "optionally disconnecting stage" (stage 404).

The next stage is the "waiting stage" (stage 409) where the full meandering controller 360 waits for a predefined amount of time before moving to the "accepting stage" (stage 402) and restarting the flow.

That amount of time can be calibrated by the user, its value will be selected also according to the size of the array and the complexity of the full meandering controller, and it can vary in range anywhere between parts of a minute and parts of an hour.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. A system for improving the operation, utility, and exploitation conditions of solar cell fields, said system comprising:
    (a) a solar cells array including:
        (i) at least one solar cells panel including:
            at least one solar cells chain including:
            at least two solar cells; and
        (ii) A dynamic interconnection matrix, wherein said interconnection matrix, connects at least two of said at least two solar cells, into said at least one solar cells chain in which the interconnection between the said modules can be changed dynamically;
    (b) The system further comprising
        (i) a direct current to alternate current duty-cycle controlled inverter operatively connected to said solar cells array;
        (ii) a digital processor operatively connected to said direct current to alternate current duty-cycle controlled inverter and
        (iii) a measuring sub-system for measuring environmental conditions, operatively connected to said digital processor, wherein said direct current to alternate current inverter is operatively connected to a power grid, wherein said measuring device includes:
            (a) a camera for recording of images of said at least-two solar cells; and
            (b) an anemometer for measuring and for transferring wind data to said digital processor, wherein said digital processor includes a controller with a databank of the modules parameters, said controller is operatively connected to said interconnection matrix and to said DC/AC inverter wherein the controller is configured to control the inverter to project the predicted MPP voltage towards the solar array, based on the recorded images and wind data.

* * * * *